United States Patent [19]

Young

[11] Patent Number: 4,645,732
[45] Date of Patent: Feb. 24, 1987

[54] METHOD FOR MANUFACTURING TWO-SIDED CIRCUIT BOARD

[75] Inventor: Walter M. Young, Largo, Fla.

[73] Assignee: AMP Incorporated, Harrisburg, Pa.

[21] Appl. No.: 452,536

[22] Filed: Dec. 23, 1982

[51] Int. Cl.4 .............................................. G03C 5/00
[52] U.S. Cl. .................................. 430/314; 430/318; 430/319; 204/15
[58] Field of Search ............... 430/312, 313, 319, 311, 430/314, 318; 204/15

[56] References Cited

U.S. PATENT DOCUMENTS 3,159,486 12/1964 Henderson .......................... 430/312
3,457,638  7/1969 Johnson .............................. 29/852
4,054,483 10/1977 Peiffer ................................ 156/632

Primary Examiner—John E. Kittle
Assistant Examiner—José G. Dees
Attorney, Agent, or Firm—F. Brice Faller

[57] ABSTRACT

Method for forming circuit traces continuously between both sides of a printed circuit board on a substrate with a profiled surface utilizes flexible artwork mask which is wrapped around edge of substrate and transparent mask holders profiled to hold the mask flushly against the surfaces and edge of the substrate.

3 Claims, 4 Drawing Figures

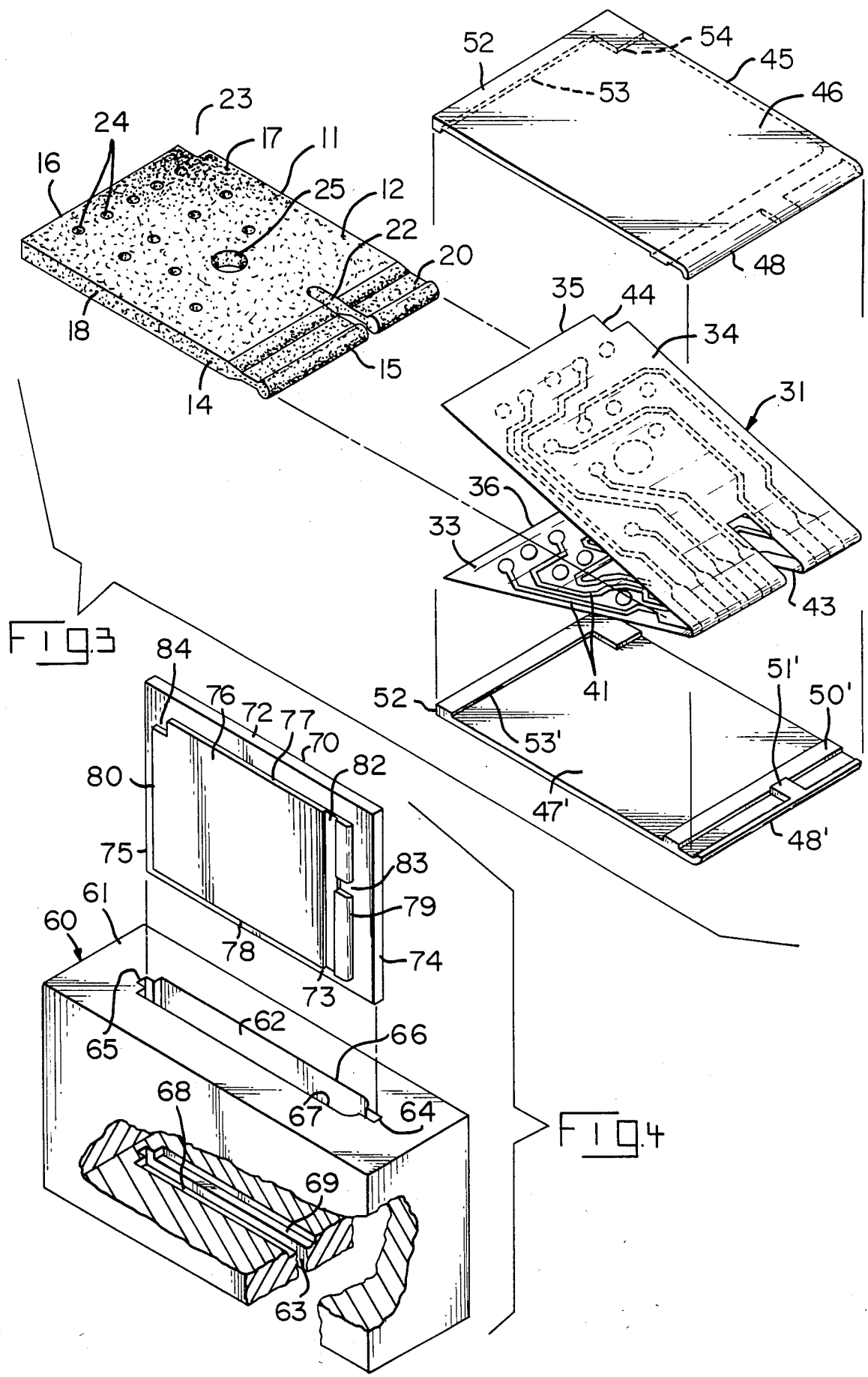

METHOD FOR MANUFACTURING TWO-SIDED CIRCUIT BOARD

BACKGROUND OF THE INVENTION

The present invention relates to a method for manufacturing a circuit board with continuous circuit traces between opposite sides.

Additive processes for manufacturing circuit boards generally involve coating a surface of a substrate with photoresist and masking the areas corresponding to desired circuit traces. Where circuitry is desired on both surfaces, a mask is prepared for the opposite side.

In order to test certain types of equipment such as racks in telephone central office equipment, it would be desirable to have test equipment connected to a circuit board which could be inserted into card edge type connectors in successive racks. A substrate profiled with a slot to insure correct alignment by mating with a key in the connector, as well as shallow channels near the mating edge of the substrate to insure retention by resilient contacts in the connector, would be most desirable. The prior art does not teach a method for forming traces on both sides of a substrate while forming continuous traces around the edge of a board so profiled.

SUMMARY OF THE PRESENT INVENTION

The present invention teaches a method for forming circuitry on both sides of a board as well as continuously around the edge thereof. The edge is rounded to facilitate mating with a card edge connector without wearing the plated contacts thereon, and the substrate has shallow channels adjacent the mating edge to facilitate retention by resilient contacts in the connector. The method involves plating a plastic substrate with electroless copper, coating the plated substrate with photoresist, and wrapping a flexible artwork mask around the mating edge of the connector. The mask is held flushly against the shallow channels in the substrate by transparent mask holders which are formed with ridges which are profiled like the channels. The mask, substrate, and holders are clamped together and exposed on both sides to ultraviolet light, exposing all but the desired circuit traces.

The method and means for carrying out same will be apparent by reference to the drawings and detailed description appended.

BRIEF DESCRIPTION OF THE DRAWINGS

FIG. 3 is an exploded perspective of the substrate, artwork mask, and holders.

FIG. 4 is a perspective of the casting apparatus for forming the mask holders.

DETAILED DESCRIPTION OF THE PREFERRED EMBODIMENT

Figure 1:
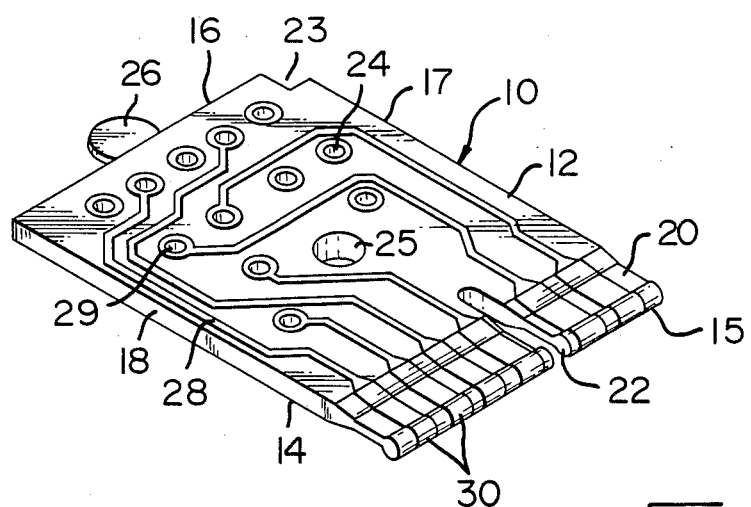
FIG. 1 is a perspective of the circuit board manufactured pursuant to the present invention.

FIG. 1 depicts a finished circuit board 10 accomplished by the manufacturing method of the present invention. The board 10 comprises a substrate 11 having a first surface 12 and an opposed second surface 14 bounded by a mating edge 15, an opposed holding edge 16, and opposed side edges 17, 18. Opposed first and second surfaces 12, 14 have opposed shallow channels 20, 21 respectively therein which are interrupted by a single slot 22 which extends into substrate 11 from mating edge 15 at a right angle thereto. The substrate 11 is formed with holes 24 therethrough which are plated through and a relatively large hole 25 which receives a screw therethrough which serves to hold two halves of a plastic housing together leaving only edge 15 and channels 20, 21 exposed. The housing is not relevant to the present invention and is not shown. Circuit traces 28 on both surfaces 12, 14 serve to interconnect plating 29 through holes 24 to edge pads 30 which are each continuous from surface 12 to surface 14. Note that edge 15 is rounded to facilitate mating to a card edge connector.

Figure 2:
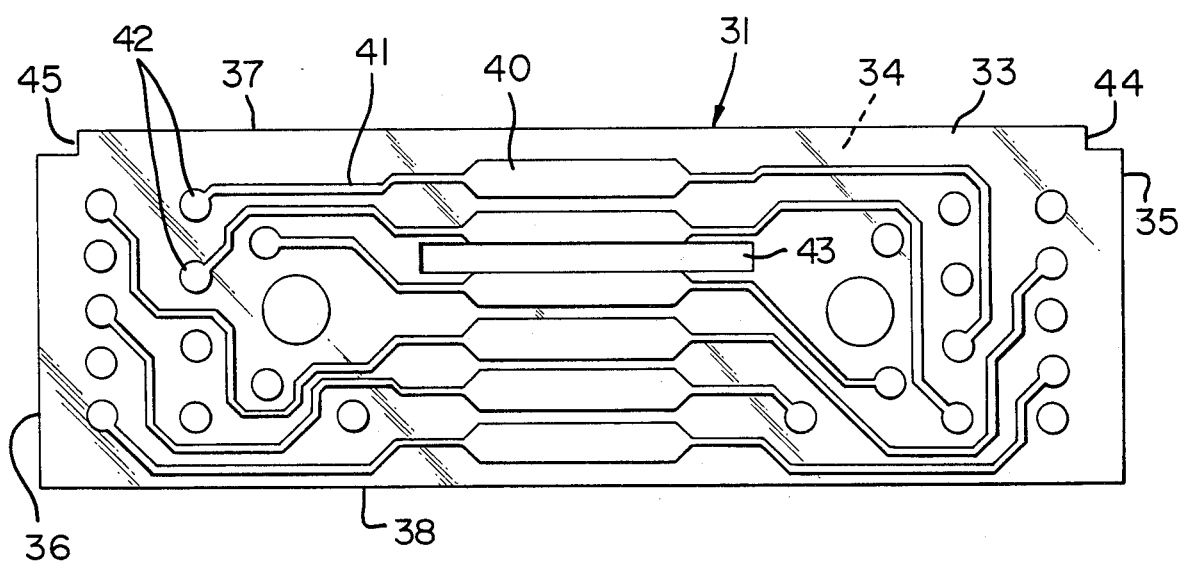
FIG. 2 is a plan of the artwork mask.

FIG. 2 is a plan view of the mask 31 used in the manufacturing method of the present invention. The mask 31 comprises a rectangular sheet of Mylar or other transparent flexible material having a first surface 33 and an opposed second surface 34 bounded by opposed first and second lateral edges 37, 38 and opposed end edges 35, 36. The first surface 33 has thereon an opaque pattern of artwork comprising pads 40, lines 41, and circles 42 which correspond to circuitry features described in conjunction with FIG. 1. The mask 31 is profiled by a rectangular aperture 43 which corresponds to slot 22 in FIG. 1 and a pair of rectangular cut-outs 44, 45 at the corners bounding lateral edge 37 and end edges 35, 36 respectively.

FIG. 3 is an exploded perspective of the substrate 11, mask 31, and first and second mask holders 45, 45'. The substrate 11 at this stage of manufacture has been plated with $30 \times 10^{-6}$ inches of copper as will be hereinafter described. The mask 31 is folded so that first surface 33 thereof will be received against first and second surfaces 12, 14 and mating edge 15 of the substrate. The lateral edges 37, 38 of the mask 31 align with side edges 17, 18 respectively of the substrate while the end edges 35, 36 align with edge 16. Cut-out 44 thus aligns with notch 23 and aperture 43 aligns with slot 22.

Referring still to FIG. 3, the mask holders 45, 45' are critical to the invention insofar as they serve to hold the mask 31 flushly against substrate 11. The mask holders 45, 45' have mirror-image profiles and thus features on holder 45' which correspond to features on holder 45 will be assigned like but primed numbers; for simplicity, only unprimed numbers will be called out. The holder 45 has an outside surface 46 and an opposed inside surface 47, the surfaces 46, 47 being bounded at opposite ends by edges 48, 52. The edge 48 is curled to fit halfway around mating end 15 of the substrate 11 while opposed end 52 has a ridge 53 on inside surface 47 which fits closely over end 16 of the substrate. The mask 31 and holder 45 are aligned to the substrate 11 by ridge 51 which is offset from end 48 and profiled to fit closely through aperture 43 in mask 31 and into slot 22 in the substrate. This feature and rectangular offset 54 at the corner of holder 45, which fits against corner cut-out 44 and notch 23 in substrate 11, serve to align the mask 31 with the substrate 11. Elongate ridge 50 which parallels edge 48 is profiled to fit in channel 20 and hold the mask 31 thereagainst. Opaque circles 42 on first surface 47 are thus aligned over holes 24 in the substrate 11.

FIG. 4 is a perspective of the casting block 60 used to manufacture the holders 45, 45'. The block 60 has a top surface 61 with a slot 62 therein. The slot 62 is generally rectangular and is profiled by end channels 64, 65 and internal sidewalls 66, 67. The block 60 is shown cut away to reveal side floors 68, 69 which parallel center slot 63. A core plate 70 is profiled with first end 74 and second end 75 which fit snugly in channels 64, 65 respectively, and top and bottom edges 72, 73. Bottom edge 73 fits closely in center slot 63 in casting block 70. A raised section 76 on the plate 70 is bounded by top edge 77, bottom edge 78, and ends 79, 80. The bottom edge 78 rests flushly on side floor 68 in the bottom of slot 62. The raised section 76 is profiled to be spaced from sidewall 67 so it can cooperate therewith to form a cavity for casting holder 45. The raised section 76 is further profiled with a channel 82 which forms ridge 50 on the holder 45 (FIG. 3) and a notch 83 which forms offset 51, as well as a cut-out 84 which forms offset 54. Note that the opposite side of core plate 70 has a raised section which is the mirror image of raised section 76. To form the holders 45, 45' the core plate 70 is inserted in slot 62, leaving two cavities between the plate 70 and respective sidewalls 66, 67. A clear casting resin is then cast into the cavities and allowed to set before removing the plate 70 by grasping top edge 72. A suitable resin for this purpose is "Castolite", a trademark of Buehler Ltd. of Lake Bluff, Ill.

The present invention resides in the method of manufacturing the circuit board of FIG. 1 utilizing the components of FIG. 3. The first step is molding by conventional means a plastic substrate 11 as above described. The substrate is then plated with copper $10^{-6}$ inches thick by electroless deposition. The copper-plated substrate is then coated with a photoresist sensitive to ultraviolet light, and the mask 31 and holders 45, 45' are assembled thereto. It is most convenient to glue the mask 31 to the holders 45, 45' to form a single hinged piece which can then be clamped to the substrate 11. The substrate 11 and mask 31 as well as holders 45, 45' assembled thereto are then exposed to ultraviolet light, which exposes and sets the photoresist everywhere not covered by the opaque pattern on the mask. The mask and holders are then removed from the substrate and the unexposed resist is washed away to expose the desired circuit pattern. The electroless copper is then electroplated with an additional $10^{-3}$ inches of copper, $10^{-4}$ inches of nickel, and $2 \times 10^{-4}$ inches of gold. The remaining resist is then removed and the remaining $10^{-6}$ inches of copper is etched off by a quick dip in ammonium persulfate. Note that the additional copper plating on the circuit traces is thick enough to suffer only negligible undercutting of the gold in the time it takes to etch away $10^{-6}$ inches.

The finished circuit board with the gold-plated pads 30 can then be assembled to a housing with wires soldered to plated through holes 24 and is suitable for use in test equipment which subjects it to repeated insertions into card edge type connectors with resilient contacts which bear on the pads 30 in channels 20.

The foregoing description is exemplary and not intended to limit the scope of the claims which follow.

I claim:

1. Method of manufacturing a circuit board having circuitry on opposed surfaces which is interconnected by circuitry on at least one edge thereof, said method comprising the steps of:
    plating a dielectric substrate with metallic conductor on said opposed surfaces and said at least one edge thereof;
    covering said substrate with photoresist, said photoresist covering said metallic conductor plated thereon;
    placing a flexible artwork mask flushly against said opposed surfaces and said edge, said mask being folded to fit around said edge, said mask having an opaque pattern thereon which corresponds to the desired circuitry, said mask being otherwise transparent;
    exposing said substrate and mask to light of a frequency which renders exposed photoresist insoluble;
    removing said mask from said substrate;
    washing away the unexposed photoresist to leave the desired circuitry, said circuitry being continuous around said edge.

2. The method of claim 1 which further comprises the step of holding said artwork mask against said substrate by means of an artwork holder comprising two pieces, said pieces being profiled to hold said mask flushly against said opposed sides and said edge, said pieces being transparent to said light.

3. The method of claim 1 which further comprises the steps of:
    electroplating said circuitry with successive platings of copper, nickel, and gold;
    removing the remaining resist from said board;
    etching away the plating outside said circuitry.

* * * * *